US 9,007,065 B2

(12) United States Patent
Shimizu

(10) Patent No.: US 9,007,065 B2
(45) Date of Patent: Apr. 14, 2015

(54) BATTERY MONITORING APPARATUS

(71) Applicant: Denso Corporation, Kariya, Aichi-pref. (JP)

(72) Inventor: Takumi Shimizu, Yokkaichi (JP)

(73) Assignee: Denso Corporation, Kariya (JP)

( * ) Notice: Subject to any disclaimer, the term of this patent is extended or adjusted under 35 U.S.C. 154(b) by 408 days.

(21) Appl. No.: 13/657,971

(22) Filed: Oct. 23, 2012

(65) Prior Publication Data

US 2013/0099793 A1 Apr. 25, 2013

(30) Foreign Application Priority Data

Oct. 24, 2011 (JP) ................................. 2011-233082

(51) Int. Cl.
 *G01N 27/416* (2006.01)
 *H02J 7/00* (2006.01)
 *G01R 31/36* (2006.01)
 *B60L 11/18* (2006.01)

(52) U.S. Cl.
 CPC ............... *G01R 31/36* (2013.01); *H02J 7/0014* (2013.01); *H02J 7/0021* (2013.01); *B60L 11/1851* (2013.01); *B60L 11/1866* (2013.01); *Y02T 10/7005* (2013.01); *Y02T 10/7061* (2013.01)

(58) Field of Classification Search
 CPC . G01R 31/36; G01R 31/3606; G01R 31/3648
 USPC .......................................... 324/426; 320/116
 See application file for complete search history.

(56) References Cited

U.S. PATENT DOCUMENTS

| 5,525,890 | A | * | 6/1996 | Iwatsu et al. .................. 320/106 |
| 5,795,301 | A | * | 8/1998 | Yasukawa et al. ............. 600/500 |
| 5,819,864 | A | * | 10/1998 | Koike et al. .................. 180/65.1 |
| 8,519,566 | B2 | * | 8/2013 | Recker et al. .................. 307/64 |

(Continued)

FOREIGN PATENT DOCUMENTS

| JP | 2006-143144 | 6/2006 |
| JP | 2006-316638 | 11/2006 |

(Continued)

OTHER PUBLICATIONS

Office Action (2 pgs.) dated Sep. 17, 2013 issued in corresponding Japanese Application No. 2011-233082 with an at least partial English-language translation thereof (2 pgs.).

*Primary Examiner* — M'Baye Diao
(74) *Attorney, Agent, or Firm* — Nixon & Vanderhye PC

(57) ABSTRACT

A battery monitoring apparatus for monitoring a battery condition of an assembled battery. In the apparatus, a control unit transmits, to a monitoring unit that is powered by the assembled battery and monitors its battery condition, a first mode-switching instruction signal for instructing the monitoring unit to transition from a normal mode to a dark-current mode. Subsequently, the control unit transmits to the monitoring unit a second mode-switching signal for instructing the monitoring unit to transition from the dark-current mode to the normal mode, and acquires an increased count value of a timer circuit in the monitoring unit for a time period from transmission of the first mode-switching instruction signal to transmission of the second mode-switching instruction signal. When it is determined that the increased count value is greater than an abnormality diagnosis criterion value, then the control unit determines that the dark-current mode of the monitoring unit is malfunctioning.

21 Claims, 3 Drawing Sheets

(56) References Cited

U.S. PATENT DOCUMENTS

| | | | |
|---|---|---|---|
| 2005/0156571 A1* | 7/2005 | Inui et al. | 320/132 |
| 2006/0112290 A1 | 5/2006 | Yamamoto et al. | |
| 2006/0175097 A1* | 8/2006 | Pirzada | 177/145 |
| 2006/0259209 A1 | 11/2006 | Sugimura | |
| 2010/0001693 A1* | 1/2010 | Iida et al. | 320/134 |
| 2010/0127824 A1* | 5/2010 | Moschl et al. | 340/5.65 |
| 2011/0133655 A1* | 6/2011 | Recker et al. | 315/159 |
| 2011/0199051 A1 | 8/2011 | Shimizu | |

FOREIGN PATENT DOCUMENTS

| | | |
|---|---|---|
| JP | 4114310 | 4/2008 |
| JP | 2011-166979 | 8/2011 |

* cited by examiner

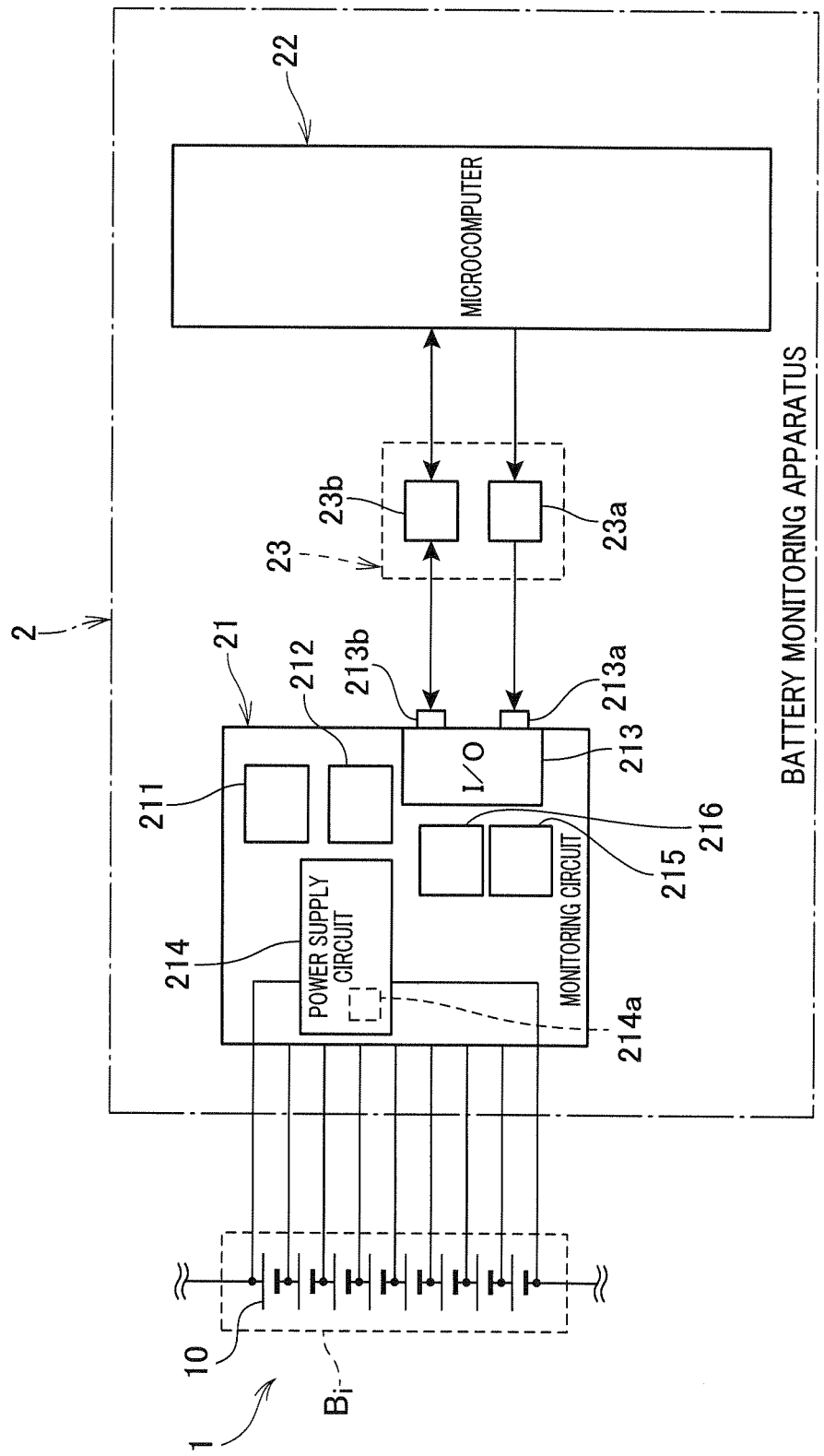

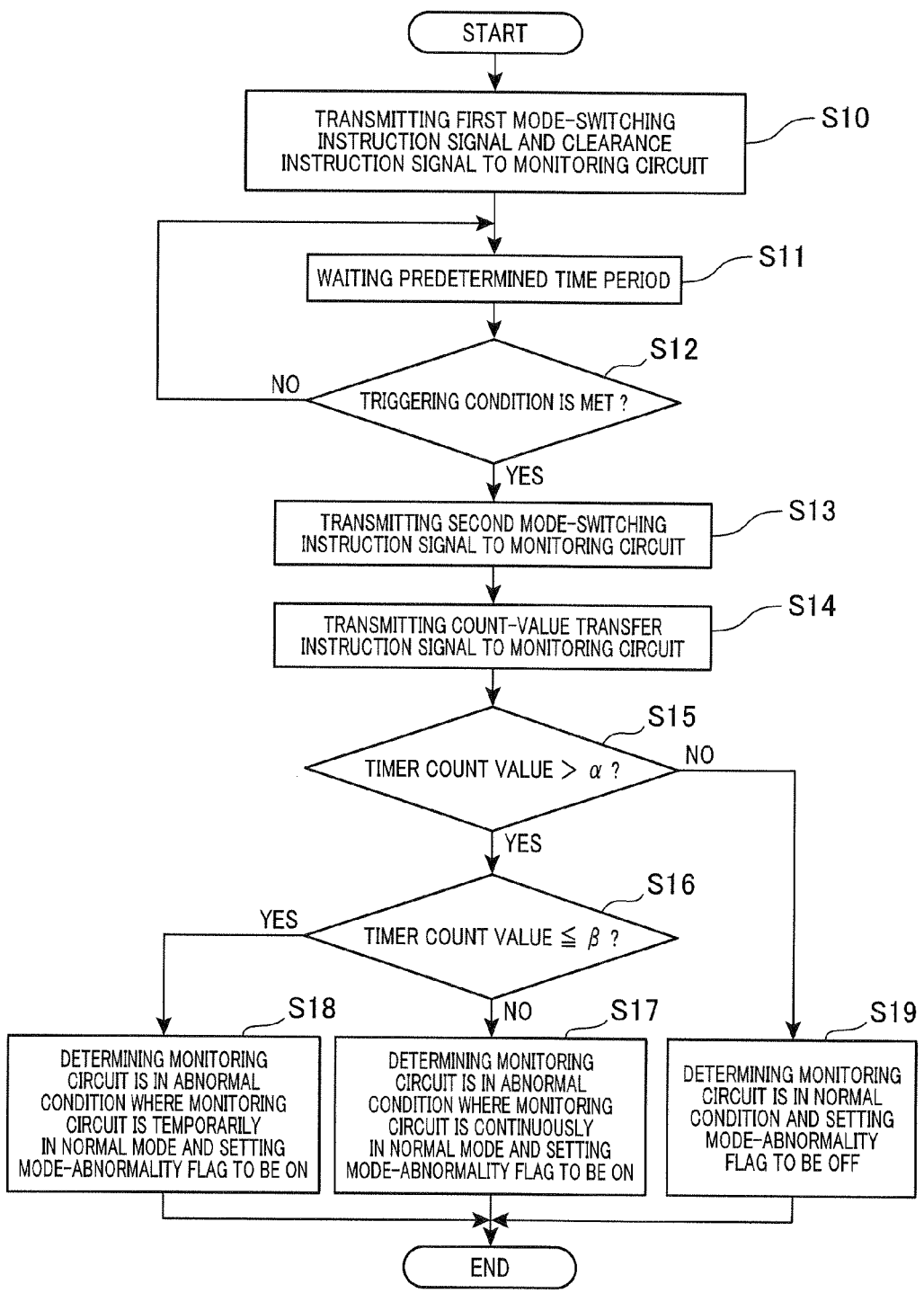

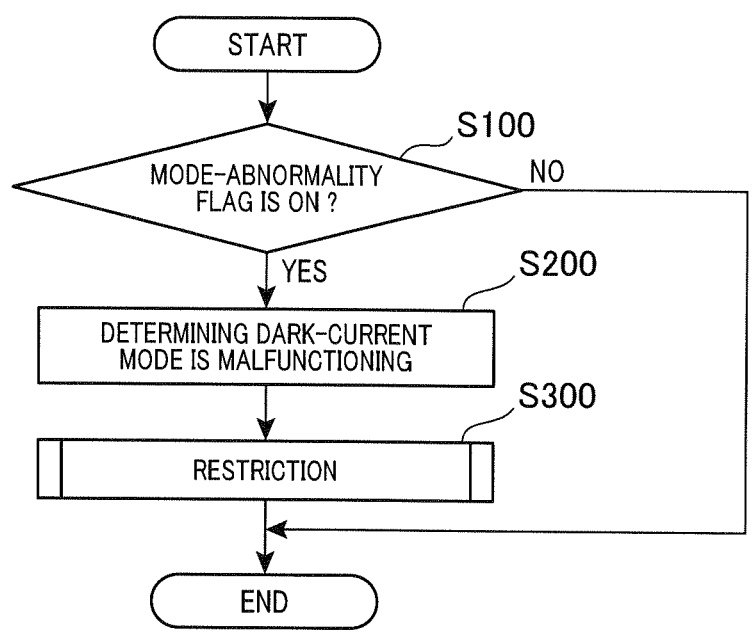

BATTERY MONITORING APPARATUS

CROSS-REFERENCE TO RELATED APPLICATION

This application is based on and claims the benefit of priority from earlier Japanese Patent Application No. 2011-233082 filed Oct. 24, 2011, the description of which is incorporated herein by reference.

BACKGROUND

1. Technical Field

The present invention relates to a battery monitoring apparatus for monitoring a battery condition of an assembled battery formed of a plurality of battery cells connected in series.

2. Related Art

A known battery monitoring apparatus includes, as main components, a monitoring unit that monitors a battery condition, such as an over-charge or over-discharge condition, of each of a plurality of battery cells forming an assembled battery, and a control unit that controls the operation of the monitoring unit.

The monitoring unit of the battery monitoring apparatus is powered by the assembled battery that is a monitored object. Therefore, the consumption of power by the monitoring circuit will lead to a reduction in state of charge (SOC) of each battery cell of the assembled battery. In addition, when the monitoring unit operates unnecessarily, the power consumed by the monitoring unit is increased, which facilitates a reduction in SOC of the assembled battery. This may lead to an over-discharge condition of each battery cell of the assembled battery.

To reduce the power consumed by the monitoring unit, there has been proposed a battery monitoring apparatus as disclosed in Japanese Patent No. 4114310 including a dark-current mode (or a sleep mode) in which power supply from the assembled battery to the monitoring unit is limited when a prescribed condition is met. The disclosed battery monitoring apparatus is configured such that the monitoring unit transitions to the dark-current mode when the control unit is receiving no monitoring results (in the form of monitoring information signals) from the monitoring unit.

In the disclosed battery monitoring apparatus, however, the control unit is unable to diagnose whether or not the dark-current mode of the monitoring unit is functioning normally. Accordingly, when the dark-current mode of the monitoring unit is malfunctioning or functioning incorrectly, the monitoring unit may unnecessarily consume the power of the assembled battery and sufficient power of the assembled battery may not be supplied to electrical loads other than the monitoring unit, such as a vehicle inverter and the like, which may prevent the electrical loads from being driven properly. Malfunction of the dark-current mode of the monitoring unit may occur when an abnormality in a switching element or the like in the monitoring unit prevents the monitoring unit from transitioning to the dark-current mode correctly or when external noise or the like causes false triggering of the monitoring unit during the dark-current mode.

In consideration of the foregoing, it would therefore be desirable to have a battery monitoring apparatus including a monitoring unit that monitors a battery condition of an assembled battery and a control unit that controls the operation of the monitoring unit, where the control unit is capable of diagnosing whether or not a dark-current mode of the monitoring unit is functioning normally.

SUMMARY

In accordance with an exemplary embodiment of the present invention, there is provided a battery monitoring apparatus for monitoring a battery condition of an assembled battery formed of a plurality of battery cells connected in series. The apparatus includes: a monitoring unit that is powered by the assembled battery and monitors the battery condition of the assembled battery; and a control unit that acquires a monitoring result indicative of the battery condition of the assembled battery from the monitoring unit and controls the operation of the monitoring unit on the basis of the monitoring result. In the apparatus, the monitoring unit transitions from a normal mode, in which power supply from the assembled battery to the monitoring unit is maintained, to a dark-current mode, in which power supply from the assembled battery to the monitoring unit is partially interrupted, in response to a first mode-switching instruction signal from the control unit for instructing the monitoring unit to transition from the normal mode to the dark-current mode, and transitions from the dark-current mode to the normal mode in response to a second mode-switching instruction signal from the control unit for instructing the monitoring unit to transition from the dark-current mode to the normal mode. The monitoring unit includes a timer circuit that starts time counting in synchrony with transition from the dark-current mode to the normal mode of the monitoring unit and stops time counting in synchrony with transition from the normal mode to the dark-current mode of the monitoring unit. The control unit transmits the second mode-switching instruction signal for instructing the monitoring unit to transition from the dark-current mode to the normal mode to the monitoring unit, subsequently acquires an increased count value of the timer circuit for a time period from transmission of the first mode-switching instruction signal to transmission of the second mode-switching instruction signal, and when the increased count value is greater than an abnormality diagnosis criterion value, then determines that the dark-current mode of the monitoring unit is malfunctioning.

In the above battery monitoring apparatus, the timer circuit in the monitoring unit stops time counting when the monitoring unit is in the dark-current mode. Therefore, in normal operation of the monitoring unit, the increased count value of the timer circuit for the time period from transmission of the first mode-switching instruction signal to transmission of the second mode-switching instruction signal should be substantially zero. Further, in the above apparatus, the control unit acquires from the monitoring unit the increased count value of the timer circuit for the time period from transmission of the first mode-switching instruction signal to transmission of the second mode-switching instruction signal. This allows the control unit to determine whether or not the dark-current mode of the monitoring unit is functioning normally on the basis of the acquired count value.

BRIEF DESCRIPTION OF THE DRAWINGS

In the accompanying drawings:

FIG. 1 schematically shows a battery control system including a battery monitoring apparatus in accordance with one embodiment of the present invention;

FIG. 2 schematically shows a flowchart of abnormality diagnosis performed by a microcomputer of the battery monitoring apparatus; and FIG. 3 schematically shows a flowchart of an abnormality response measure performed by the microcomputer of the battery monitoring apparatus.

DESCRIPTION OF SPECIFIC EMBODIMENTS

There will now be explained a battery monitoring apparatus in accordance with one embodiment of the present invention with reference to FIGS. 1 to 3. The battery monitoring apparatus 2 is applied to a battery control system for an assembled battery, which is a high-voltage battery mounted in a hybrid vehicle or an electrical vehicle. As shown in FIG. 1, main components of the battery control system of the present embodiment are the assembled battery 1 and the battery monitoring apparatus 2.

The assembled battery 1 of the present embodiment supplies electrical power to various electrical loads, such as an electrical motor (not shown) or the like for driving the vehicle. More specifically, the assembled battery 1 is a series connection of a plurality of battery cells 10 each being a lithium-ion battery or the like. The series connection of battery cells 10 is divided into a plurality of battery blocks B1 to Bn each being a series connection of an equal number of battery cells (eight cells per block in the present embodiment). For illustration purposes only, FIG. 1 shows only one block Bi (1≤i≤n).

The assembled battery 1 is electrically connected to the battery monitoring apparatus 2 via sense lines. The battery monitoring apparatus 2 is operable to monitor a battery condition, such as an over-discharge condition or an over-charge condition, of each battery cell of the assembled battery 1 (an abnormal condition detection function) and to equalize cell voltages of the respective battery cells 10 of the assembled battery 1 (a cell-voltage equalization function). The over-discharge condition is an abnormal condition where a voltage of each battery cell 10 is too low to ensure reliability of the system. The over-charge condition is an abnormal condition where a voltage of each battery cell 10 is too high to ensure reliability of the system.

More specifically, the battery monitoring apparatus 2 includes, as main components, a plurality of monitoring circuits 21 (each as a monitoring unit or monitoring means) respectively associated with the plurality of battery blocks B and each adapted to monitor a battery condition of a respectively corresponding battery block B, a microcomputer 22 (as a control unit or control means) adapted to control the operation of each of the plurality of monitoring circuits 21, and a plurality of signal transfer circuits 23 (each as a signal transfer unit or signal transfer means) respectively associated with the plurality of monitoring circuits 21 and each adapted to transfer communication signals between a respectively corresponding monitoring circuit 21 and the microcomputer 22 in an electrically insulating manner.

Each monitoring circuit 21 is powered by a respectively corresponding high-voltage battery block B that is a monitored object of the monitoring circuit 21. The microcomputer 22 is powered by a low-voltage auxiliary battery (not shown), such as a 12V battery. That is, each monitoring circuit 21 of the present embodiment is included in a high-voltage system, and the microcomputer 22 is included in a low-voltage system.

The monitoring circuit 21 is electrically connected to positive and negative terminals of each battery cell 10 of the monitored battery block B via sense lines to detect a voltage across each battery cell 10. Detected cell-voltage values of the respective battery cells 10 of the monitored battery block B are outputted from the monitoring circuit 21 to the microcomputer 22. As described above, the plurality of monitoring circuits 21 correspond one-to-one to the plurality of battery blocks B1 to Bn. Therefore, the explanations regarding a specific one of the plurality of monitoring circuits 21 corresponding to the battery block Bi that is illustrated in FIG. 1 are applicable equally to each of the other monitoring circuits 21.

The monitoring circuit 21 includes a voltage detection circuit 211 that detects a voltage across each battery cell 10 of the monitored battery block B, an cell-voltage equalization circuit 212 that equalizes cell voltages of the respective battery cells of the monitored battery block B, an interface circuit 213 (as an interface unit or interface means) that outputs and receives various signals, a power supply circuit 214, a timer circuit 215, a memory 216 (as a storage circuit or storage means) and others.

The voltage detection circuit 211 of the present embodiment includes a plurality of selection switches (not shown) each electrically connected to a respectively corresponding battery cell 10 of the monitored battery block B, a multiplexer (not shown) adapted to select and turn on and off an arbitrary one of the plurality of selection switches, an A/D convertor (not shown) adapted to convert an analog signal (indicative of voltage values) acquired via the multiplexer to digital data, and others.

The cell-voltage equalization circuit 212 detects cell-to-cell voltage variations in the monitored battery block B with reference to detected voltage values from the voltage detection circuit 211 and regulates or minimizes the cell-to-cell voltage variations by discharging a battery cell 10 having the highest cell voltage thereacross among the battery cells 10 of the monitored battery block B (cell-voltage equalization discharge).

The interface circuit (or input/output circuit) 213 outputs a signal to and receives a signal from the microcomputer 22 via the signal transfer circuit 23 (as a signal transfer unit or as signal transfer means). The interface circuit 213 includes a first terminal 213a for receiving first and second mode-switching instruction signals (which will be described later) from the microcomputer 22 and a second terminal 213b for outputting to and receiving from the microcomputer 22 communication signals other than the first and second mode-switching instruction signals. The first terminal 213a may be a chip select terminal (CS terminal).

The first mode-switching instruction signal is outputted from the microcomputer 22 to each monitoring circuit 21 for instructing the monitoring circuit 21 to transition from a normal mode, in which power supply from the monitored battery block B to the monitoring circuit 21 is maintained, to a dark-current mode, in which power supply from the monitored battery block B to the monitoring circuit 21 is partially interrupted. The second mode-switching instruction signal is outputted from the microcomputer 22 to each monitoring circuit 21 for instructing the monitoring circuit 21 to transition from the dark-current mode to the normal mode.

The power supply circuit 214 of the present embodiment is electrically connected to a positive terminal of the highest-side battery cell 10 (the top battery cell in FIG. 1) within the monitored battery block B and to a negative terminal of the lowest-side battery cell 10 (the bottom battery cell in FIG. 1) and converts a voltage across the battery block B into a desired voltage to supply the desired voltage to each of the elements 211 to 213, 215 and 216 of the monitoring circuit 21.

The power supply circuit 214 includes a mode switcher 214a for switching between the normal mode and the dark-current mode of the monitoring circuit 21 in response to the first or second mode-switching instruction signal from the microcomputer 22. The mode switcher 214a may include a switching element that electrically connects and disconnects between the power supply circuit 214 and each of the elements 211 to 213, 215 of the monitoring circuit 21. It should be noted that, during the dark-current mode of the monitoring circuit 21, at least power supply to the memory 216 and power supply to some elements necessary for transition from the dark-current mode to the normal mode are maintained without being interrupted.

The timer circuit 215 starts time counting in synchrony with transition from the dark-current mode to the normal mode of the monitoring circuit 21. On the other hand, the timer circuit 215 stops the time counting in synchrony with transition from the normal mode to the dark-current mode of the monitoring circuit 21. During the dark-current mode of the monitoring circuit 21, power supply from the assembled battery 1 to the timer circuit 215 is interrupted so that the time counting is stopped in the timer circuit 215. In the present embodiment, an output count value of the timer circuit 215 (a timer count value) is transferred to the microcomputer 22 in response to a count-value transfer instruction signal from the microcomputer 22.

The memory 216 is operative to store the count value outputted from the timer circuit 215. Power supply from the assembled battery 1 to the memory 216 is maintained even during the dark-current mode of the monitoring circuit 21. This allows the count value of the timer circuit 215 to be retained in the memory 216 during the dark-current mode. The count value stored in the memory 216 is cleared or deleted in response to a clearance instruction signal from the microcomputer 22.

The microcomputer 22 includes MPU (not shown), ROM (not shown), EEPROM (not shown), RAM (not shown) and others, and is operable to perform various processes in accordance with programs stored in the ROM or the like.

The microcomputer 22 of the present embodiment transmits various instruction signals to each monitoring circuit 21, acquires output signals, such as signals indicative of monitoring results, of each monitoring circuit 21, and diagnoses a battery condition of the assembled battery 1 and/or an abnormality in each monitoring circuit 21 on the basis of the acquired signals.

The various instruction signals outputted from the microcomputer 22 to each monitoring circuit 21 may include a monitoring instruction signal for instructing the monitoring circuit 21 to monitor a battery condition of each battery cell 10 of the monitored battery block B, a cell-voltage equalization instruction signal for instructing the monitoring circuit 21 to perform cell-voltage equalization discharge, in which the battery cells of the monitored battery block B are discharged so that their cell voltages become substantially equal to each other, the first mode-switching instruction signal for instructing the monitoring circuit 21 to transition from the normal mode to the dark-current mode, the second mode-switching instruction signal for instructing the monitoring circuit 21 to transition from the dark-current mode to the normal mode, a count-value transfer instruction signal for instructing the monitoring circuit 21 to transfer the count value outputted from the timer circuit 215 to the microcomputer 22, and a clearance instruction signal for instructing the monitoring circuit 21 to clear or delete the count value stored in the memory 216.

The monitoring instruction signal and the cell-voltage equalization instruction signal are transmitted from the microcomputer 22 to each monitoring circuit 21, for example, during ON state of a starting switch, such as an ignition switch (not shown), of the vehicle.

The first mode-switching instruction signal is transmitted from the microcomputer 22 to each monitoring circuit 21 for instructing the monitoring circuit 21 to transition from the normal mode to the dark-current mode, when the starting switch of the vehicle is turned off. The second mode-switching instruction signal is transmitted from the microcomputer 22 to each monitoring circuit 21 for instructing the monitoring circuit 21 to transition from the dark-current mode to the normal mode, when a prescribed triggering condition is met.

The clearance instruction signal is transmitted, together with the first mode-switching instruction signal, from the microcomputer 22 to each monitoring circuit 21, when the starting switch of the vehicle is turned off.

Since a cell-voltage of each battery cell 10 of the assembled battery 1 is less likely to vary during the OFF state of the starting switch of the vehicle, the microcomputer 22 transmits to each monitoring circuit 21 the first mode-switching instruction signal for instructing the monitoring circuit 21 to transition from the normal mode to the dark-current mode. This allows power consumption to be reduced in each monitoring circuit 21.

Each signal transfer circuit 23 is responsible for signal transfer between a respectively corresponding monitoring circuit 21 and the microcomputer 22 in an electrically insulated manner. The signal transfer circuit 23 of the present embodiment includes a first signal transfer section 23a for transferring the first and second mode-switching instruction signals from the microcomputer 22 to the monitoring circuit 21 and a second signal transfer section 23b for transferring communication signals other than the first and second mode-switching instruction signals (i.e., the monitoring instruction signal, the cell-voltage equalization instruction signal, the count-value transfer instruction signal, the clearance instruction signal etc.) between the microcomputer 22 and the monitoring circuit 21. That is, in the signal transfer circuit 23 of the present embodiment, the first signal transfer section 23a and the second signal transfer section 23b are separate and independent from each other.

The first signal transfer section 23a includes an optically-coupled insulating element for unidirectionally transferring signals, such as the first and second mode-switching instruction signals, from the microcomputer 22 to the monitoring circuit 21. Since the first and second mode-switching instruction signals don't have to be transferred at a high rate, the optically-coupled insulating element may be a photocoupler. The first signal transfer section 23a is powered not by the assembled battery 1, but by the auxiliary battery for driving the microcomputer 22. This allows the first signal transfer section 23a to transfer signals from the microcomputer 22 to the monitoring circuit 21 regardless of whether the monitoring circuit 21 is in the normal mode or in the dark-current mode.

The second signal transfer section 23b includes a pair of optically-coupled insulating elements for bidirectionally transferring signals (other than the mode-switching instruction signals) between the microcomputer 22 and the monitoring circuit 21. Since the second signal transfer section 23b may transfer the signals required to be transferred at a higher rate than the mode-switching instruction signals, each optically-coupled insulating element of the pair may be a photo-IC coupler including a high-speed logic IC for accelerating signal transfer.

The second signal transfer section 23b is configured such that the insulating element (including the high-speed logic IC) of the pair, dedicated to signal transfer from the monitoring circuit 21 to the microcomputer 22, is powered by the assembled battery 1. Therefore, the second signal transfer section 23b is able to transfer the signals (other than the mode-switching instruction signals) from the monitoring circuit 21 to the microcomputer 22, only when the monitoring circuit 21 is in the normal mode. In other words, when the monitoring circuit 21 is in the dark-current mode, the second signal transfer section 23b is unable to transfer the signals from the monitoring circuit 21 to the microcomputer 22.

There will now be explained operations of the battery monitoring apparatus 2 in accordance with the present embodiment. The battery monitoring apparatus 2 of the present embodiment monitors a battery condition of the assembled battery 1, equalizes cell voltages of the respective battery cells 10 of the assembled battery 1, and performs diagnosis of abnormality in each monitoring circuit 21. The battery monitoring apparatus 2 further performs an abnormality response measure in response to the abnormality diagnosis.

At first, monitoring and cell-voltage equalization of the assembled battery 1 performed in the battery monitoring apparatus 2 will be explained. As described above, the battery monitoring apparatus 2 of the present embodiment is configured such that each monitoring circuit 21 is powered by the corresponding battery block B of the assembled battery 1 and each signal transfer circuit 23 is partially powered by the power supply circuit 21 of the corresponding monitoring circuit 21. With configuration, the monitoring of the assembled battery 1 is triggered, for example, by an external command.

The microcomputer 22 transmits the monitoring instruction signal to each monitoring circuit 21 via the second signal transfer section 23b of the signal transfer circuit 23 to instruct the monitoring circuit 21 to monitor a battery condition of each battery cell 10 of the monitored battery block B. In each monitoring circuit 21 having received the monitoring instruction signal from the microcomputer 22, the voltage detection circuit 211 detects a battery condition, such as a cell voltage or the like, of each battery cell of the monitored battery block B. Subsequently, the monitoring circuit 21 transmits an output signal indicative of the battery condition of each battery cell 10 detected by the voltage detection circuit 211 to the microcomputer 22 via the second signal transfer section 23b of the signal transfer circuit 23. The microcomputer 22 diagnoses a battery condition of each battery cell 10 of the assembled battery 1 on the basis of the output signal of each monitoring circuit 21.

When it is determined by the microcomputer 22 that at least one of the cell-to-cell voltage variations of the assembled battery 1 exceeds a predetermined value, the microcomputer 22 transmits the cell-voltage equalization instruction signal to each monitoring circuit 21 via the second signal transfer section 23b of the signal transfer circuit 23 to instruct the monitoring circuit 21 to equalize cell voltages of the respective battery cells 10 of the monitored battery block B. In each monitoring circuit 21 having received the cell-voltage equalization instruction signal from the microcomputer 22, the cell-voltage equalization circuit 212 equalizes cell-voltages of the respective battery cells 10 of the monitored battery block B by performing the cell-voltage equalization discharge. The cell-voltage equalization discharge is performed repeatedly until the cell-to-cell voltage variations are lowered below the predetermined value.

There will now be explained abnormality diagnosis for diagnosing whether or not the dark-current mode of each monitoring circuit 21 of the battery monitoring apparatus 2 is functioning normally with reference to FIG. 2. FIG. 2 shows a flowchart of the abnormality diagnosis of the present embodiment performed by the microcomputer 22. A control routine shown in FIG. 2 is performed when the starting switch of the vehicle is turned off.

At first, as shown in FIG. 2, the microcomputer 22 transmits to each monitoring circuit 21 the first mode-switching instruction signal for instructing the monitoring circuit 21 to transition from the normal mode to the dark-current mode and the clearance instruction signal via the signal-transfer circuit 23 in step S10. To clear or delete the count value stored in the memory 216 reliably, the mode-switching instruction signal may be transmitted subsequently to the transmission of the clearance instruction signal.

Thereafter, in step S11, the microcomputer 22 waits a predetermined time period, where the predetermined time period is set to a time period required for the monitoring circuit 21 to transition from the normal mode to the dark-current mode.

Subsequently, in step S12, the microcomputer 22 determines whether or not a specific triggering condition is met. The specific triggering condition may be such a condition that another predetermined time period (e.g., one hour) has elapsed or an external instruction signal for instructing the monitoring circuit 21 to monitor the battery block B has been received after waiting for the predetermined time period in step S11.

If it is determined in step S12 that the specific triggering condition has not been met yet, then the abnormality diagnosis returns to step S11, where the microcomputer 22 waits the predetermined time period again. If it is determined in step S12 that the specific triggering condition has been met, then the microcomputer 22 transmits to the monitoring circuit 21 the second mode-switching instruction signal for instructing the monitoring circuit 21 to transition from the dark-current mode to the normal mode, in step S13.

Thereafter, in step S14, the microcomputer 22 transmits to the monitoring circuit 21 the count-value transfer instruction signal for instructing the monitoring circuit 21 to transfer a count value outputted from the timer circuit 215 and stored in the memory 216 to the microcomputer 22 to acquire the count value.

The time counting in the timer circuit 215 is stopped during the dark-current mode. Therefore, as far as the dark-current mode of the monitoring circuit 21 is functioning normally, the count value acquired from the memory 216 of the monitoring circuit 21 is substantially zero.

However, when the count value acquired from the memory 216 of the monitoring circuit 21 is not substantially zero, it is evident that the time counting has been performed continuously or temporarily in the timer circuit 215 during a time period from transmission of the first mode-switching instruction signal to transmission of the second mode-switching instruction signal from the microcomputer 22 to the monitoring circuit 21. Therefore, it can be assumed that the monitoring circuit 21 is in an abnormal condition where the dark-current mode thereof is malfunctioning.

As such, in step S15, the microcomputer 22 compares the count value of the timer circuit 215 acquired in step S14 with an abnormality diagnosis criterion value a [alpha] (or a criterion value for the abnormality diagnosis) to determine whether or not the timer count value is greater than the abnormality diagnosis criterion value $\alpha$. The abnormality diagnosis criterion value $\alpha$ is set no less than a time period (a delay time) from transmission of the first mode-switching instruction signal from the microcomputer 22 to the monitoring circuit 21 to the actual completion of transition from the normal mode to the dark-current mode in response to the first mode-switching instruction signal.

If it is determined in step S15 that the count value of the timer circuit 215 acquired in step S14 is greater than the abnormality diagnosis criterion value $\alpha$, then in step S16 the microcomputer 22 determines whether or not the count value of the timer circuit 215 is equal to or less than a preset threshold β [beta] that is set greater than the abnormality diagnosis criterion value α.

The preset threshold β makes it possible to determine whether the time counting has been performed temporarily or continuously in the timer circuit 215 after the transmission of the first mode-switching instruction signal from the microcomputer 22 to the monitoring circuit 21. The preset threshold β is set less than the time period from transmission of the first mode-switching instruction signal to transmission of the second mode-switching instruction signal from the microcomputer 22 to the monitoring circuit 21. For example, the preset threshold β may be the predetermined time period in step S11.

If it is determined in step S16 that the count value of the timer circuit 215 is greater than the preset threshold β, then it is determined in step S17 that the monitoring circuit 21 is in an abnormal condition where the monitoring circuit 21 is continuously in the normal mode. This is because the timer circuit 215 is likely to have continued time counting during the time period from transmission of the first mode-switching instruction signal to transmission of the second mode-switching instruction signal from the microcomputer 22 to the monitoring circuit 21. Such an abnormal condition may be caused by a stuck state fault or the like in the mode switcher 214a of the power supply circuit 214. Thereafter, the abnormality diagnosis is ended.

If it is determined in step S16 that the count value of the timer circuit 215 is equal to or less than the preset threshold β, then it is determined in step S18 that the monitoring circuit 21 is in an abnormal condition where the monitoring circuit 21 is temporarily in the normal mode. This is because the timer circuit 215 is likely to have performed time counting temporarily during the time period from transmission of the first mode-switching instruction signal to transmission of the second mode-switching instruction signal from the microcomputer 22 to the monitoring circuit 21. Such an abnormal condition may be caused by false triggering of the monitoring circuit 21 due to external noise or transition delay from the normal mode to the dark-current mode or the like of the monitoring circuit 21. Thereafter, the abnormality diagnosis is ended.

Further, in each of steps S17, S18, since it has been determined in step S15 that the count value of the timer circuit 215 is greater that the abnormality diagnosis criterion value α, a mode-abnormality flag, which is indicative of whether or not the dark-current mode of the monitoring circuit 21 is functioning normally, is set to be "ON" (or "1"), and the flag state "ON" is stored in a memory of the microprocessor 22, such as EEPROM.

Meanwhile, if it is determined in step S15 that the count value of the timer circuit 215 is equal to or less than the abnormality diagnosis criterion value α, then it is determined in step S19 that the monitoring circuit 21 is in a normal condition where the dark-current mode of the monitoring circuit 21 is functioning normally. Further, in step S19, the mode-abnormality flag is set to be "OFF" (or "0"), and the flag state "OFF" is stored in the memory of the microprocessor 22. Thereafter, the abnormality diagnosis is ended.

In the abnormality diagnosis performed by the microcomputer 22, the operation in step S13 is performed by means (or a function) of the microcomputer 22 for transmitting to each monitoring circuit 21 the second mode-switching instruction signal for instructing the monitoring circuit 21 to transition from the dark-current mode to the normal mode. The operation in step S14 is performed by means (or a function) of the microcomputer 22 for transmitting the count-value transfer instruction signal to each monitoring circuit 21 after transmission of the second mode-switching instruction signal for instructing the monitoring circuit 21 to transition from the dark-current mode to the normal mode. The operations in steps S15 to S18 are performed by means (or a function) of the microcomputer 22 for determining that the dark-current mode of the monitoring circuit 21 of the monitoring circuit 21 is malfunctioning when the count value of the timer circuit 215 is greater than the abnormality diagnosis criterion value α.

There will now be explained an abnormality response measure performed by the microcomputer 22 subsequently to the abnormality diagnosis with reference to FIG. 3. FIG. 3 shows a flowchart of the abnormality response measure of the present embodiment. A control routine shown in FIG. 3 is performed by the microcomputer 22 when the starting switch of the vehicle is turned on subsequently to the abnormality diagnosis of FIG. 2.

At first, as shown in FIG. 3, it is determined in step S100 whether or not the mode-abnormality flag is ON (or 1). If it is determined in step S100 that the mode-abnormality flag is OFF (or 0), then the abnormality response measure is ended.

If it is determined in step S100 that the mode-abnormality flag is ON (or 1), then it is determined in step S200 that the monitoring circuit 21 is in an abnormal condition where the dark-current mode is malfunctioning. Subsequently, a restriction process for suppressing adverse effects caused by malfunction of the dark-current mode is performed in step S300. Thereafter, the abnormality response measure is ended.

In the restriction process of the preset embodiment, an allowable lower limit that limits a state of charge (SOC) of the assembled battery 1 is raised greater than the allowable lower limit when the mode-abnormality flag is OFF (or 0). For example, assuming that the allowable lower limit of SOC of the assembled battery 1 when the mode-abnormality flag is OFF (or 0) is approximately 20%, the allowable lower limit is raised in a range of 60% to 80% in the restriction process.

This can prevent the assembled battery 1 from being over-discharged even when power of the assembled battery 1 is consumed by the monitoring circuits 21.

Further, in the restriction process (step S300) of the present embodiment, transmission of the cell-voltage equalization instruction signal for instructing the monitoring circuit 21 to perform the cell-voltage equalization discharge is inhibited. This can prevent power of the assembled battery 1 from being unnecessarily consumed, thereby preventing the assembled battery 1 from being over-discharged.

In the abnormality response measure performed by the microcomputer 22, The operation in step S300 is performed by means (or a function) of the microcomputer 22 for raising the allowable lower limit of SOC of the assembled battery 1 and inhibiting transmission of the cell-voltage equalization instruction signal to the monitoring circuit 21.

In the battery monitoring apparatus 2 of the present embodiment as described above, the timer circuit 215 of the monitoring circuit 21 is configured to stop time counting when the monitoring circuit 21 is in the dark-current mode, and the microcomputer 22 acquires a count value of the timer circuit 215 for a time period from transmission of the first mode-switching instruction signal to transmission of the second mode-switching instruction signal (that is, an increased count value for the time period), where the first mode-switching instruction signal is transmitted from the microcomputer 22 to the monitoring circuit 21 for instructing the monitoring circuit 21 to transition from the normal mode to the dark-current mode, and the second mode-switching instruction signal is transmitted from the microcomputer 22 to the monitoring circuit 21 for instructing the monitoring circuit 21 to transition from the dark-current mode to the normal mode. This allows the microcomputer 22 to determine whether or not the dark-current mode of the monitoring circuit 21 is functioning normally on the basis of the acquired count value.

Further, in the battery monitoring apparatus 2 of the present embodiment as described above, the microcomputer 22 discriminates between the abnormal condition where the monitoring circuit 21 is continuously in the normal mode and the abnormal condition where the monitoring circuit 21 is temporarily in the normal mode on the basis the count value of the timer circuit 215 for the time period from transmission of the first mode-switching instruction signal to transmission of the second mode-switching instruction signal. This allows the microcomputer 22 to precisely diagnose whether or not the dark-current mode of the monitoring circuit 21 is functioning normally.

Modifications

There will now be explained some modifications of the above embodiment that may be devised without departing from the spirit and scope of the present invention.

(1) In the abnormality diagnosis of above described embodiment, the microcomputer 22 is preferably configured to diagnose whether or not the monitoring circuit 21 is in an abnormal condition where the dark-current mode of the monitoring circuit 21 is malfunctioning, and when it is determined that the monitoring circuit 21 is in such an abnormal condition, further diagnose whether the monitoring circuit 21 is in an abnormal condition where the monitoring circuit 21 is temporarily in the normal mode or in an abnormal condition where the monitoring circuit 21 is continuously in the normal mode. Alternatively, the microcomputer 22 may be configured to only diagnose whether or not the monitoring circuit 21 is in an abnormal condition where the dark-current mode of the monitoring circuit is malfunctioning, where the further diagnosis of whether the monitoring circuit 21 is in an abnormal condition where the monitoring circuit 21 is temporarily in the normal mode or in an abnormal condition where the monitoring circuit 21 is continuously in the normal mode is removed. In such an alternative embodiment, if it is determined in step S15 of FIG. 2 that the count value of the timer circuit 215 is greater than the abnormality diagnosis criterion value α, then it is determined that the monitoring circuit 21 is in an abnormal condition where the dark-current mode is malfunctioning. Thereafter, the abnormality diagnosis may be ended.

In a further alternative embodiment, the microcomputer 22 may be configured to diagnose whether or not the monitoring circuit 21 is in an abnormal condition where the dark-current mode of the monitoring circuit is malfunctioning, and when it is determined that the monitoring circuit 21 is in such an abnormal condition, further diagnose either whether or not the monitoring circuit 21 is in an abnormal condition where the monitoring circuit 21 is temporarily in the normal mode or whether or not the monitoring circuit 21 is in an abnormal condition where the monitoring circuit 21 is continuously in the normal mode.

Further, in the abnormality diagnosis of above described embodiment, a preset threshold for determining whether or not the monitoring circuit 21 is in an abnormal condition where the monitoring circuit 21 is continuously in the normal mode (a first preset threshold) is set equal to a preset threshold for determining whether the monitoring circuit 21 is in an abnormal condition where the monitoring circuit 21 is temporarily in the normal mode (a second preset threshold). That is, the first and second preset thresholds are equal to each other and denoted by β. Alternatively, the first and second preset thresholds may be different. More specifically, the first preset threshold may be greater than the second preset threshold. In such an alternative embodiment, when the count value of the timer circuit 215 is greater than the first preset threshold, then it may be determined that the monitoring circuit 21 is in an abnormal condition where the monitoring circuit 21 is continuously in the normal mode. When the count value of the timer circuit 215 is equal to or less than the second preset threshold, then it may be determined that the monitoring circuit 21 is in an abnormal condition where the monitoring circuit 21 is temporarily in the normal mode. And when the count value of the timer circuit 215 is equal to or less than the first preset threshold and greater than the second preset threshold, then it may be determined that the monitoring circuit 21 is in an abnormal condition where the dark-current mode of the monitoring circuit 21 is malfunctioning.

(2) In the above described embodiment, the microcomputer 22 transmits to each monitoring circuit 21 the clearance instruction signal together with the mode-switching instruction signal for instructing the monitoring circuit 21 to transition from the normal mode to the dark-current mode (the first mode-switching instruction signal) to thereby clear the count value stored in the memory 216.

Alternatively to the above described embodiment, for example, the microcomputer 22 may transmit to each monitoring circuit 21 not the clearance instructing signal, but the count-value transfer instruction signal, together with the first mode-switching instruction signal to acquire the count value stored in the timer circuit 215. In such an alternative embodiment, the microcomputer 22 can also diagnose whether or not the monitoring circuit 21 is in an abnormal condition where the dark-current mode of the monitoring circuit 21 is malfunctioning by comparing a difference between the count value at the time of transmission of the first mode-switching instruction signal and the count value at the time of transmission of the second mode-switching instruction signal with the abnormality diagnosis criterion value α.

(3) In the above described embodiment, the monitoring circuit 21 includes the memory 216 for storing the count value outputted from the timer circuit 215 during the dark-current mode of the monitoring circuit 21. The count value stored in the memory 216 is cleared or deleted in response to the clearance instruction signal from the microcomputer 22.

Alternatively, for example, the memory 216 may be removed from the monitoring circuit 21. This may lead to a reduction in power consumption in the monitoring circuit 21. In such an alternative embodiment, the monitoring circuit 21 may reset a count value of the timer circuit 215 to zero upon transition from the normal mode to the dark-current mode regardless of whether or not the monitoring circuit 21 has received the first mode-switching instruction signal from the microcomputer 22, and subsequently to transmitting the first mode-switching instruction signal to the monitoring circuit 21, the microcomputer 22 may transmit the count-value transfer instruction signal together with the second mode-switching instruction signal to the monitoring circuit 21 for instructing the monitoring circuit 21 to transfer the count value of the timer circuit 215 to the microcomputer 22. It should, however, be noted that in such an alternative embodiment the count value of the timer circuit 215 is substantially zero when the monitoring circuit 21 is in the dark-current mode at the time of transmission of the second mode-switching instruction signal from the microcomputer 22 to the monitoring circuit 21. Therefore, in the abnormality diagnosis of the embodiment, it becomes difficult to diagnose whether or not the monitoring circuit 21 is in an abnormal condition where the monitoring circuit 21 is temporarily in the normal mode during the time period from transmission of the first mode-switching instruction signal to transmission of the second mode-switching instruction signal from the microcomputer 22, while it is still possible to diagnose whether or not the monitoring circuit 21 is in an abnormal condition where the monitoring circuit 21 is continuously in the normal mode.

(4) In the above described embodiment, the first signal transfer section 23a includes a single optically-coupled insulating element, and the second signal transfer section 23b includes a pair of optically-coupled insulating elements. Alternatively, each of these optically-coupled insulating elements may be replaced by an inductively-coupled (transformer coupling) insulating element or by a capacitively-coupled (capacitor coupling) insulating element.

(5) In the above described embodiment, the signal transfer circuit 23 includes the first signal transfer section 23a dedicated to transferring of the first and second mode-switching instruction signals from the microcomputer 22 to the monitoring circuit 21. Alternatively, in some embodiments where the mode switcher 214a of the power supply circuit 214 of the monitoring circuit 21 can be controlled by the first and second mode-switching instruction signals transmitted from the microcomputer 22, the second signal transfer section 23b of the signal transfer circuit 23 may be used to transfer the first and second mode-switching instruction signals from the microcomputer 22 to the monitoring circuit 21, where the first signal transfer section 23a may be removed.

Preferably, as described above, the second signal transfer section 23b includes a pair of insulating elements adapted to transfer communication signals at a high rate. However, when the communication signals are not required to be transferred at a high rate, the second signal transfer section 23b may include a pair of insulating elements adapted to transfer the communication signals at a lower rate.

(6) Preferably, as described above, when it is determined in the abnormality diagnosis that the monitoring circuit 21 is in an abnormal condition where the dark-current mode of the monitoring circuit 21 is malfunctioning, the abnormality response measure is performed upon subsequent turning on of the starting switch of the vehicle. Alternatively, for example, the abnormality response measure may not be performed when malfunction of the dark-current mode is likely to cause less adverse effects.

(7) In the restriction process of the abnormality response measure of the above described embodiment, the allowable lower limit of SOC of the assembled battery 1 is raised and the cell-voltage equalization in the monitoring circuit 21 is inhibited. Alternatively, in the restriction process of the abnormality response measure, the allowable lower limit of SOC of the assembled battery 1 may be raised, or else the cell-voltage equalization in the monitoring circuit 21 may be inhibited. Further, in the abnormality response measure, a user or maintenance personnel may be informed of occurrence of the abnormality.

(8) Preferably, as described above, the monitoring circuit 21 includes the cell-voltage equalization circuit 212. Alternatively, when cell-to-cell voltage variations are of less concern, the cell-voltage equalization circuit 212 may be removed. In such an alternative embodiment, meausres other than the inhibition of the cell-voltage equalization may be performed in the abnormality response measure.

(8) In the above described embodiment, the diagnosis of abnormality in the monitoring circuit 21 (the control routine shown in FIG. 2) is performed during the OFF state of the starting switch of the vehicle. Alternatively, for example, the diagnosis of abnormality in the monitoring circuit 21 may be triggered by an external instruction signal from a control device external to the battery monitoring apparatus 2 during the ON state of the starting switch of the vehicle.

In the above described embodiment, the abnormality response measure (the control routine shown in FIG. 3) is performed when the starting switch of the vehicle is turned on subsequently to the abnormality diagnosis of FIG. 2. Alternatively, the abnormality response measure may be performed immediately after it is determined in the abnormality diagnosis that the monitoring circuit 21 is in an abnormal condition where the dark-current mode of the monitoring circuit 21 is malfunctioning or may be performed a prescribed time period after the abnormality diagnosis.

(9) In the above described embodiment, the battery monitoring apparatus 2 is applied to the assembled battery 1 that is a vehicle-mounted high-voltage battery. Alternatively, the battery monitoring apparatus 2 may be applied to the other kinds of batteries.

Many modifications and other embodiments of the invention will come to mind to one skilled in the art to which this invention pertains having the benefit of the teachings presented in the foregoing descriptions and the associated drawings. Therefore, it is to be understood that the invention is not to be limited to the specific embodiments disclosed and that modifications and other embodiments are intended to be included within the scope of the appended claims. Although specific terms are employed herein, they are used in a generic and descriptive sense only and not for purposes of limitation.

What is claimed is:

1. A battery monitoring apparatus for monitoring a battery condition of an assembled battery formed of a plurality of battery cells connected in series, comprising:
    a monitoring unit that is powered by the assembled battery and monitors the battery condition of the assembled battery; and
    a control unit that acquires a monitoring result indicative of the battery condition of the assembled battery from the monitoring unit and controls the operation of the monitoring unit on the basis of the monitoring result;
    wherein the monitoring unit transitions from a normal mode, in which power supply from the assembled battery to the monitoring unit is maintained, to a dark-current mode, in which power supply from the assembled battery to the monitoring unit is partially interrupted, in response to a first mode-switching instruction signal from the control unit for instructing the monitoring unit to transition from the normal mode to the dark-current mode, and transitions from the dark-current mode to the normal mode in response to a second mode-switching instruction signal from the control unit for instructing the monitoring unit to transition from the dark-current mode to the normal mode, and the monitoring unit comprises a timer circuit that starts time counting in synchrony with transition from the dark-current mode to the normal mode of the monitoring unit and stops time counting in synchrony with transition from the normal mode to the dark-current mode of the monitoring unit, and
    the control unit transmits the second mode-switching instruction signal for instructing the monitoring unit to transition from the dark-current mode to the normal mode to the monitoring unit, subsequently acquires an increased count value of the timer circuit for a time period from transmission of the first mode-switching instruction signal to transmission of the second mode-switching instruction signal, and when the increased count value is greater than an abnormality diagnosis criterion value (α), then determines that the dark-current mode of the monitoring unit is malfunctioning.

2. The apparatus of claim 1, wherein when the monitoring unit is in the dark-current mode, the monitoring unit is unable to output communication signals.

3. The apparatus of claim 1, wherein the abnormality diagnosis criterion value (α) is set no less than a time period from the transmission of the first mode-switching instruction signal from the control unit to the monitoring unit to the completion of transition from the normal mode to the dark-current mode of the monitoring unit in response to the first mode-switching instruction signal.

4. The apparatus of claim 1, wherein
the monitoring unit further comprises a memory that stores a count value outputted from the timer circuit during the dark-current mode of the monitoring unit, and the monitoring unit clears the count value stored in the memory in response to a clearance instruction signal transmitted from the control unit for instructing the monitoring unit to clear the count value stored in the memory.

5. The apparatus of claim 4, wherein the control unit transmits the clearance instruction signal together with the first mode-switching instruction signal to the monitoring unit.

6. The apparatus of claim 4, wherein the control unit transmits the clearance instruction signal to the monitoring unit prior to transmitting the first mode-switching instruction signal to the monitoring unit.

7. The apparatus of claim 5, wherein the control unit transmits a count-value transfer instruction signal to the monitoring unit for instructing the monitoring unit to transfer the count value of the timer circuit stored in the memory to the control unit, after transmitting the second mode-switching instruction signal to the monitoring unit, thereby acquiring the increased count value of the timer circuit.

8. The apparatus of claim 6, wherein the control unit transmits a count-value transfer instruction signal to the monitoring unit for instructing the monitoring unit to transfer the count value of the timer circuit stored in the memory to the control unit, after transmitting the second mode-switching instruction signal to the monitoring unit, thereby acquiring the increased count value of the timer circuit.

9. The apparatus of claim 7, wherein when it is determined by the control unit that the dark-current mode of the monitoring unit is malfunctioning, then the control unit determines whether or not the increased count value of the timer circuit is greater than a preset threshold (β), which is set greater than the abnormality diagnosis criterion value (α), and when it is determined that the increased count value of the timer circuit is greater than the preset threshold (β), then determines that the monitoring unit is in an abnormal condition where the monitoring unit is continuously in the normal mode during the time period from transmission of the first mode-switching instruction signal to transmission of the second mode-switching instruction signal.

10. The apparatus of claim 7, wherein when it is determined by the control unit that the dark-current mode of the monitoring unit is malfunctioning, then the control unit determines whether or not the increased count value of the timer circuit is equal to or less than a preset threshold (β), which is set greater than the abnormality diagnosis criterion value, and when it is determined that the increased count value of the timer circuit is equal to or less than the preset threshold (β), then determines that the monitoring unit is in an abnormal condition where the monitoring unit is temporarily in the normal mode during the time period from transmission of the first mode-switching instruction signal to transmission of the second mode-switching instruction signal.

11. The apparatus of claim 9, wherein the preset threshold (β) is set less than the time period from transmission of the first mode-switching instruction signal to transmission of the second mode-switching instruction signal.

12. The apparatus of claim 1, wherein the monitoring unit resets a count value of the timer circuit to zero upon transition from the normal mode to the dark-current mode of the monitoring unit.

13. The apparatus of claim 12, wherein the control unit transmits a count-value transfer instruction signal together with the second mode-switching instruction signal to the monitoring unit for instructing the monitoring unit to transfer the count value of the timer circuit to the control unit, thereby acquiring the increased count value of the timer circuit.

14. The apparatus of claim 13, wherein when it is determined by the control unit that the dark-current mode of the monitoring unit is malfunctioning, then the control unit determines whether or not the increased count value of the timer circuit is greater than a preset threshold (β), which is set greater than the abnormality diagnosis criterion value, and when it is determined that the increased count value of the timer circuit is greater than the preset threshold (β), then determines that the monitoring unit is in an abnormal condition where the monitoring unit is continuously in the normal mode during the time period from transmission of the first mode-switching instruction signal to transmission of the second mode-switching instruction signal.

15. The apparatus of claim 1, wherein the control unit raises an allowable lower limit of state of charge (SOC) of the assembled battery when it is determined by the control unit that the dark-current mode of the monitoring unit is malfunctioning.

16. The apparatus of claim 1, wherein
the monitoring unit performs cell-voltage equalization discharge to equalize cell voltages of the respective battery cells of the assembled battery in response to a cell-voltage equalization instruction signal from the control unit, and
the control unit inhibits itself from transmitting the cell-voltage equalization instruction signal to the monitoring unit when it is determined that the dark-current mode of the monitoring unit is malfunctioning.

17. The apparatus of claim 1, wherein
the monitoring unit performs cell-voltage equalization discharge to equalize cell voltages of the respective battery cells of the assembled battery in response to a cell-voltage equalization instruction signal from the control unit, and
when it is determined by the control unit that the dark-current mode of the monitoring unit is malfunctioning, the control unit raises an allowable lower limit of state of charge (SOC) of the assembled battery and inhibits itself from transmitting to the monitoring unit the cell-voltage equalization instruction signal for instructing the monitoring unit to equalize cell voltages of the respective battery cells of the assembled battery.

18. The apparatus of claim 1, further comprising a signal transfer unit that transfers communication signals including the first and second mode-switching instruction signals between the monitoring unit and the control unit.

19. The apparatus of claim 18, wherein the signal transfer unit comprises:
a first signal transfer section that transfers the first and second mode-switching instruction signals unidirectionally from the control unit to the monitoring unit; and a second signal transfer section that transfers the communication signals other than the first and second mode-switching instruction signals bidirectionally between the control unit and the monitoring unit, the second signal transfer section being separate and independent from the first signal transfer section.

20. The apparatus of claim 19, wherein the second signal transfer section comprises a pair of signal transfer elements, a first signal transfer element of the pair being dedicated to unidirectional signal transfer from the monitoring unit to the control unit, and a second transfer element of the pair being dedicated to unidirectional signal transfer from the control unit to the monitoring unit, and the first signal transfer element is powered by the assembled battery through the monitoring unit.

21. The apparatus of claim 1, wherein the apparatus is mounted in a vehicle.

\* \* \* \* \*